(12) United States Patent
Bogner et al.

(10) Patent No.: US 7,446,347 B2
(45) Date of Patent: Nov. 4, 2008

(54) OPTOELECTRONIC COMPONENT AND METHOD FOR THE PRODUCTION THEREOF, MODULE AND DEVICE COMPRISING A MODULE OF THIS TYPE

(75) Inventors: Georg Bogner, Lappersdorf (DE); Herbert Brunner, Regensburg (DE); Wolfgang Lex, Barbing (DE); Gunter Waitl, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 182 days.

(21) Appl. No.: 10/362,614

(22) PCT Filed: Aug. 22, 2001

(86) PCT No.: PCT/DE01/03197

§ 371 (c)(1),
(2), (4) Date: Aug. 1, 2003

(87) PCT Pub. No.: WO02/17405

PCT Pub. Date: Feb. 28, 2002

(65) Prior Publication Data

US 2004/0047151 A1    Mar. 11, 2004

(30) Foreign Application Priority Data

Aug. 23, 2000 (DE) ............................ 100 41 328

(51) Int. Cl.
*H01L 33/00* (2006.01)
(52) U.S. Cl. .................................................. 257/99

(58) Field of Classification Search ........... 257/99–100, 257/431–433, E31.105
See application file for complete search history.

(56) References Cited

U.S. PATENT DOCUMENTS

| 5,998,925 | A  | * | 12/1999 | Shimizu et al. | 313/503 |
|---|---|---|---|---|---|
| 6,340,824 | B1 | * | 1/2002 | Komoto et al. | 257/99 |
| 6,593,598 | B2 | * | 7/2003 | Ishinaga | 257/98 |
| 6,674,097 | B2 | * | 1/2004 | Komoto et al. | 257/98 |
| 6,680,568 | B2 | * | 1/2004 | Fujiwara et al. | 313/501 |

(Continued)

FOREIGN PATENT DOCUMENTS

DE         31 48 843        6/1983

(Continued)

OTHER PUBLICATIONS

Weinheim G. Trogisch, "Flexible Leiterplatten im Aufwind", Feinwerk & Messtechnik 97 (1989). pp. 485-488.

(Continued)

*Primary Examiner*—Nathan W Ha
(74) *Attorney, Agent, or Firm*—Cohen Pontani Lieberman & Pavane LLP

(57) ABSTRACT

The invention relates to an optoelectronic component, having a semiconductor chip (1) which is mounted on a flexible chip support (6), in which conductor tracks (3, 5) for electrically connecting the semiconductor chip (1) are embodied on a first main face, and on which a housing frame (7) is disposed that is filled with a radiation-permeable medium, in particular a filler compound. A display device, an illumination or backlighting device, and a method for producing components of the invention are also disclosed.

18 Claims, 2 Drawing Sheets

U.S. PATENT DOCUMENTS

| | | | |
|---|---|---|---|
| 6,712,529 B2* | 3/2004 | Horio | 385/92 |
| 6,858,879 B2* | 2/2005 | Waitl et al. | 257/99 |
| 6,946,714 B2* | 9/2005 | Waitl et al. | 257/434 |
| 2005/0082561 A1* | 4/2005 | Suehiro et al. | 257/99 |
| 2005/0110123 A1* | 5/2005 | Waitl et al. | 257/678 |

FOREIGN PATENT DOCUMENTS

| | | |
|---|---|---|
| DE | 3829553 | 3/1989 |
| DE | 295 04 631 | 3/1995 |
| DE | 199 51 865 | 8/2000 |
| EP | 0 588 040 | 3/1994 |
| EP | 08264841 | 10/1996 |
| EP | 0911573 | 4/1999 |
| EP | 11121808 | 4/1999 |
| EP | 0 921 568 | 6/1999 |
| JP | 57089276 | 6/1982 |
| JP | 59078584 | 5/1984 |
| JP | 59107584 | 6/1984 |
| JP | 02206179 | 8/1990 |
| JP | 06112536 | 4/1994 |
| JP | 07220972 | 8/1995 |
| JP | 08125228 | 5/1996 |
| JP | 11284233 | 10/1999 |
| WO | WO 80/01860 | 9/1980 |
| WO | WO 88/02533 | 9/1987 |

OTHER PUBLICATIONS

Frank Möllmer, et al., "Siemens SMT-TOPLED für die Oblerflächenmontage". Siemens Components 29 (1991), pp. 147-149.

* cited by examiner

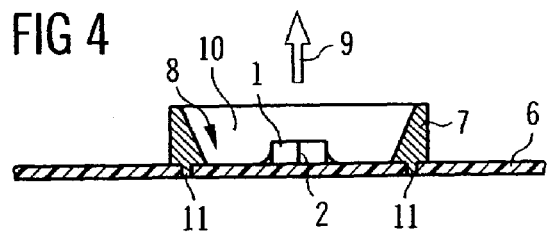
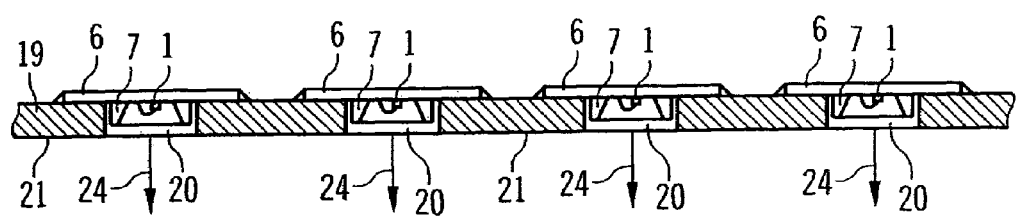
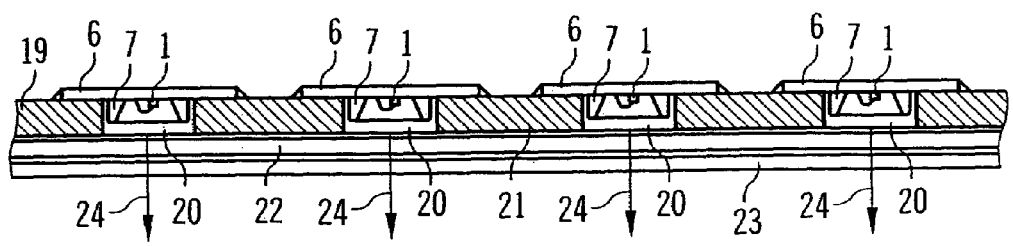

US 7,446,347 B2

OPTOELECTRONIC COMPONENT AND METHOD FOR THE PRODUCTION THEREOF, MODULE AND DEVICE COMPRISING A MODULE OF THIS TYPE

This is a U.S. national stage of application No. PCT/DE01/03197, filed on 22 Aug. 2001.

FIELD OF THE INVENTION

The invention relates to an optoelectronic component with a semiconductor chip, in particular a surface-mountable optoelectronic component for mounting in openings in printed circuit boards. It also relates to a method for producing a plurality of optoelectronic components of this kind, to a module having a plurality of such optoelectronic components, and to a display device as well as an illumination or backlighting device having such a module.

BACKGROUND OF THE INVENTION

Typically, optoelectronic components such as light emitting diode components are offered in so-called radial designs, which are secured to printed circuit boards by through-mounting, or in surface-mountable designs. For instance, one can refer to F. Möllmer and G. Waitl, *SIEMENS SMT-TOPLED für die Oberflächenmontage* [SIEMENS SMT-TOPLED for Surface Mounting], Siemens Components 29 (1991), No. 4, pages 147-149. Both types of design can be disposed in printed circuit board recesses or openings only with considerable technological effort.

SUMMARY OF THE INVENTION

One object of the present invention is to develop a design for an optoelectronic component that makes a low structural height possible and that can be positioned in a simple way in recesses or openings of printed circuit boards.

This and other objects are attained in accordance with one aspect of the invention directed to an optoelectronic component, having a semiconductor chip which is mounted on a flexible chip support, in which conductor tracks for electrically connecting the semiconductor chip are embodied on a first main face, and on which a housing frame is disposed that is filled with a radiation-permeable medium, in particular a filler compound.

Because the conductor tracks are embodied on the flexible chip support, the flexible chip support itself becomes an element of the component that can advantageously simultaneously be used for packaging the component.

In a component assembly machine, such components are preferably not lifted from a flexible support, such as a packaging belt; instead, the flexible chip support is cut apart into components in accordance with the subdivision of the flexible chip support, and the components thus obtained are placed on a printed circuit board. In a design according to the invention, separate packaging belts are advantageously not necessary.

In a preferred embodiment, the flexible chip support is a plastic film. Components that are especially low in height are thus obtained.

In a preferred embodiment, the semiconductor chip is a light emitting diode chip, which is disposed in the center of a housing frame embodied on the flexible chip support. The result is light sources of low structural height, which are especially well suited for conductor track openings in mobile radio communication devices, such as cellular phones, for instance for backlighting a keypad or a display.

BRIEF DESCRIPTION OF THE DRAWINGS

FIG. 4, a schematic illustration of a cross-sectional view through the light emitting diode component of FIG. 3;

FIG. 5, a schematic sectional view through a module having a plurality of components of the invention; and FIG. 6, a schematic sectional view through a liquid crystal display with a backlighting device with a plurality of components of the invention.

DETAILED DESCRIPTION OF THE DRAWINGS

Figure 1:
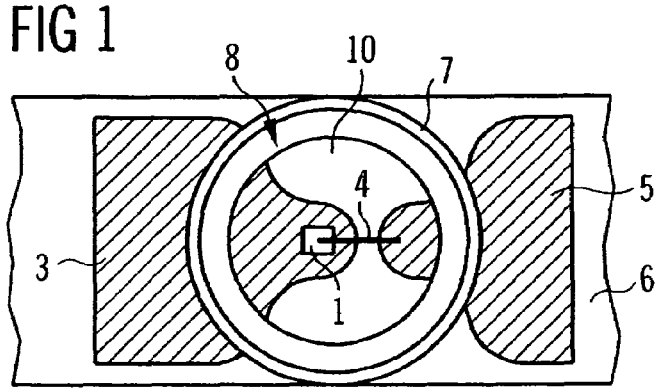
FIG. 1, a schematic illustration of a plan view on a light emitting diode component of the invention.

In the various exemplary embodiments, elements that are the same or function the same are each provided with the same reference numerals.

Figure 2A:
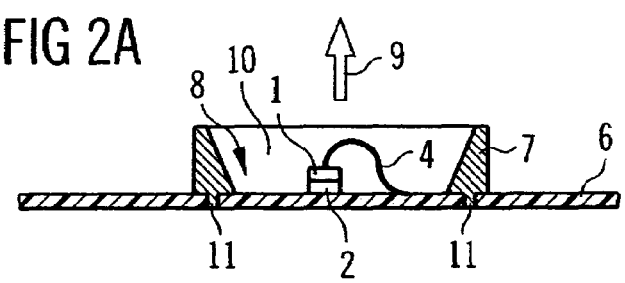
FIG. 2A, a schematic illustration of a cross-sectional view through the light emitting diode component of FIG. 1.
Figure 2B:
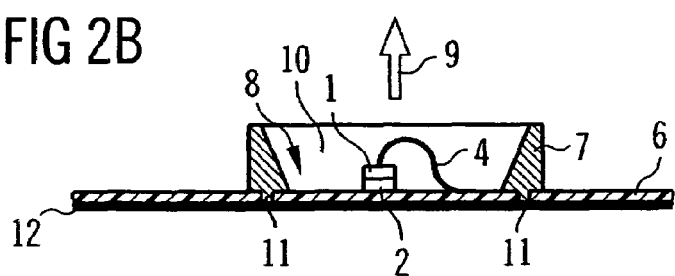
FIG. 2B is identical to FIG. 2A, with the exception that a shielding layer is shown therein.

The component shown in FIGS. 1, 2A and 2B is for example a light emitting diode component and has a radiation-emitting semiconductor chip 1, which contains a radiation-emitting active layer 2. The semiconductor chip 1 is electrically conductively connected by its underside to a first contact layer 3. The top side of the semiconductor chip 1 is connected via a bond wire 4 to a second contact layer 5. The first contact layer 3 and the second contact layer 5 are produced for instance from metal foils, which are laminated onto a flexible chip support film 6.

In an alternative semiconductor chip, which has both electrical connection faces on the top, both connection faces are connected to the contact layers 3 and 5, for instance by means of bond wires. Here, the semiconductor chip can once again be secured to one of the contact layers 3 and 5, or between the two contact layers 3 and 5.

The semiconductor chip 1 is located in the center of an annular reflector frame 7, with a funnel-shaped inside 8 that is preferably embodied reflectively. As a result, the reflector frame 7 is capable of deflecting radiation, emitted toward the side from the semiconductor chip 1, in a projection direction 9.

The interior enclosed by the reflector frame 7 is filled with a transparent filler compound 10, in which luminescent pigments may be embedded that at least partly absorb the radiation emitted by the semiconductor chip 1 and re-emit radiation of a different wavelength from the absorbed radiation.

Figure 3:
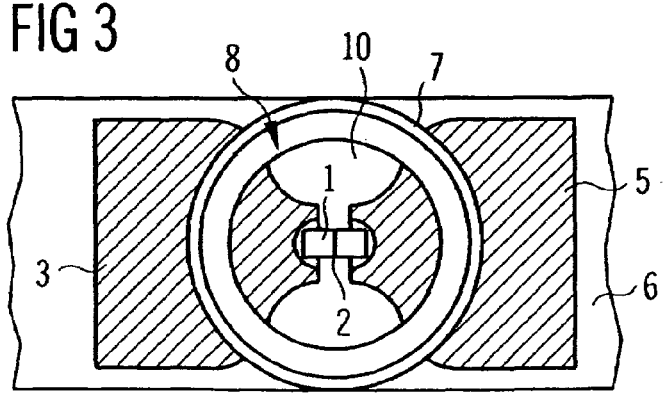
FIG. 3, a schematic illustration of a plan view on a further exemplary embodiment of a light emitting diode component of the invention.

In FIGS. 3 and 4, a modified exemplary embodiment of the light emitting diode component described in conjunction with FIGS. 1, 2A and 2B is shown. In this exemplary embodiment, the semiconductor chip 1 is secured, tipped onto a side face, to the first contact layer 3 and the second contact layer 5. In this case, the active layer 2 is at a right angle to the chip support film 6. This arrangement has the advantage of not requiring any bond wires for securing the semiconductor chip 1 to the contact layers. However, a disadvantage is that one side of the active layer 2 is covered by the chip support film 6. Moreover, the top and bottom sides of the semiconductor chip 1 are at least partly covered with material that is used to secure the semiconductor chip 1 to the first contact layer 3 and the second contact layer 5. In comparison to the exemplary embodiment shown FIGS. 1, 2A and 2B, the light yield is less in the light emitting diode of FIGS. 3 and 4.

As a material for the chip support film 6, especially temperature-proof and metallizable plastic films can be considered. For instance, the chip support film 6 can be an epoxy-resin-based chip support film, or it can be made from polyimide or a polyester, such as polyethylene naphthalate. As the material for the reflector frame 7, temperature-stable and optically reflective materials such as polyphthalamide (PPA), liquid crystal polymer (LCP), and polyetheretherketone (PEEK) are especially suitable. Other thermoplastics can also be considered, as long as they are temperature-stable and optically reflective. Such thermoplastics can have a very high reflectivity, from embedded pigments, such as $TiO_2$.

The materials are selected such that the reflector frame 7 sticks to the chip support film 6. To improve the strength of the bond between the reflector frame 7 and the chip support film 6, at least one opening or recess in the chip support film 6 may be provided, which is engaged by a retaining peg 11 of the reflector frame 7.

As the material for the filler compound 10, one of the usual reaction resins for producing optoelectronic semiconductor components can be used, such as epoxy resin, silicone resin, or acrylate-like compounds.

As the luminescent material, a pigment based on cerium-doped yttrium-aluminum-garnet (YAG:Ce) is suitable, such as $(Y_{1-x-y}Gd_xTb_y)_3Al_5O_{12}$:Ce, where $0 \leq x \leq 1$, $0 \leq y \leq 1$, and $x+y \leq 1$.

In addition to the luminescent material, a diffusor material such as titanium dioxide, barium oxide, zirconium dioxide, or dialuminum trioxide can be included in the filler compound 10. This diffusor material advantageously contributes to a more-homogeneous appearance of the projected light. If no beam conversion is to be effected but instead only scattering of the emitted radiation, then to that end the filler compound 10 can contain only diffusor material but not any luminescent material.

For producing the light emitting diodes, a metal foil is preferably first laminated to a chip support film strip and then coated with a photoresist layer. The photoresist layer is exposed to light, and then the photoresist layer and the metal foil are structured, by-an etching process known per se, so that many pairs of contact layers 3 and 5 are removed, and the reflector frame 7 is applied to the chip support film strip, for instance by means of transfer molding or injection molding. For anchoring the reflector frame 7 to the chip support film 6, openings are made in the film which can be engaged by the pegs 11 of the reflector frame 7.

As an alternative to the injection molding or transfer molding of the reflector frame, it is conceivable to simply place and/or glue prefabricated reflector frames 7 onto the chip support film 6.

Next, each semiconductor chip 1 is placed on the chip support film strip. After each semiconductor chip 1 has been bonded and the wire connection 4 has been made between the top contact of the chip 1 and the contact layer 5, the interior of the associated reflector frame 7 is filled with the filler compound 10. The chip support film 6 is then folded or rolled up, creating an easily handled packaging unit for the light emitting diodes.

As an alternative to the procedure explained above, the respective reflector frame 7 can be applied only after the associated semiconductor chip 1 has been mounted on the chip support film 6.

In the exemplary embodiments shown in FIGS. 1-4, the chip support film 6 is embodied in bandlike form, and the semiconductor chips 1 are lined up along the chip support film 6. In addition, the chip support film 6 can be selected to be wide enough that there is space for a plurality of rows of light emitting diode chips side by side.

It is also possible to dispose a plurality of

It is also possible to dispose a plurality of semiconductor chips 1 within a single reflector 7 and in this way to obtain among other things light emitting diode components that light up in various colors or that emit multicolored light.

Also in the design according to the invention, the back side of the chip support film 6 can likewise be provided in a simple way with a metallizing layer or metallizing structure 12 as a shielding layer, in particular over the full surface, which serves to shield against interfering waves in high-frequency applications.

The designs described here are distinguished by requiring comparatively little space and by the possibility of being virtually completely sunk in an opening in a printed circuit board. The flexible chip support film 6 can furthermore be adapted without difficulty to various spatial conditions. Since furthermore the chip support film 6 is embodied as generally thin, the light emitting diodes generally have a low structural height. Especially flat components are therefore obtained.

A further advantage is that the chip support film 6 and the reflector frame 7 can be made from materials that have identical or at least very similar coefficients of thermal expansion. This makes the reliability of the light emitting diodes in temperature cycles very high.

Finally, it is also advantageous that the light emitting diode components produced by means of the chip support film 6 no longer require any particular additional packaging belt for packaging and shipping. The elastic chip support film can advantageously fully perform the role of a The chip support film strip is preferably not cut apart into the desired individual components or groups of components made up of a plurality of components until just before the components are mounted.

If light emitting diode components produced in this way are to be used for backlighting a keypad, for instance in a mobile radio communication device, then the chip support film can be cut apart on the assembly line for the mobile radio set, and the intended groups of light emitting diodes can be inserted jointly into the mobile radio set. In such an application, the circuits required for triggering the light emitting diode chips are expediently already embodied on the chip support film 6.

The method has been described above in terms of light emitting diodes. However, other semiconductor chips can be packaged and made easy to handle in the manner described as well.

In FIG. 5, a module with a plurality of components of the invention is shown. A plurality of openings 20 is made in a substrate element 19, such as a printed circuit board. The substrate element 19 also has a projection side 21.

A plurality of radiation-emitting components of the invention are secured to the side of the substrate element 19 opposite the projection side 21; a housing frame 7 of each radiation-emitting component protrudes into a respective one of the openings 20, and the projection direction 24 extends through the openings 20.

Each chip support 6 rests with its electrical strip conductors 3 and 5 of the component on the surface, opposite the projection side 21, of the substrate element 19. For securing the components, adhesive connections or soldered connections can be employed. Because the chip support 6 is preferably embodied as flat, the space required horizontally and vertically is markedly less than in components of the prior art. In particular, the invention makes an at least partly sunken mounting of the components possible.

Because the chip support 6 is embodied flexibly, the component is flexible enough to elastically or optionally plastically absorb warping and deformation, without harmful warping being transmitted to the housing or to a radiation-emitting chip located in it. This mounting arrangement is especially well suited for tightly packed flat display modules.

The substrate, or at least the surface on the projection side, is preferably radiation-absorbent, for instance being blackened, so that the contrast between the individual radiation-emitting components and the environment is enhanced. This is especially advantageous in arrangements intended as a display device.

In FIG. 6, another arrangement of components of the invention is shown. Unlike the arrangement described above, the arrangement shown in FIG. 6 is suitable in particular as background lighting, for instance for a liquid crystal display.

As in the previous exemplary embodiment, radiation-sunken fashion on a substrate 19. On the projection side, a scattering plate 22 is downstream of the substrate or components. Also, the substrate 19 or at least the projection-side surface of the substrate 19 is preferably uniformly diffusely reflective, for instance being white. This enables largely homogeneous backlighting of extremely flat construction. Downstream of the scattering plate is for instance a liquid crystal display (LCD) 23 that is to be illuminated.

The substrate 19 can either be rigid, as described above, or flexible, for instance being embodied as a plastic or ceramic film, so that a backlighting or display module can be adapted in a simple way to various shapes and advantageously can even be mounted on surfaces the shape of which changes with time.

It is understood that the explanation of the invention in terms of the exemplary embodiments shown is not meant to limit the invention. For instance, the chip can be mounted directly on a chip mounting face of the chip support, for instance being glued, and the chip can be electrically connected to the conductor tracks solely by means of wire connections. The chip can equally well be mounted on a separate thermal connection that is embedded in the chip support and that can in turn be connected electrically to the conductor tracks by means of wire connections. Heat is transferred from the through the thermal connection, such as to a heat sink. None of these embodiments are outside the fundamental concept of the present invention.

What is claimed is:

1. An optoelectronic component comprising:
   a flexible chip support having a first main face with an opening or recess formed therein;
   a semiconductor chip mounted on the chip support;
   a pair of conductor tracks on the first main face of the chip support for electrically connecting the semiconductor chip; and
   a housing frame disposed on the first main face of the chip support and filled with a radiation-permeable medium, the housing frame comprising a retaining peg,
   wherein the opening or recess is engaged by the retaining peg.

2. The component of claim 1, wherein the semiconductor chip is a light emitting diode chip.

3. The component of claim 2, wherein the inside face of the housing frame is embodied as a reflector, which deflects electromagnetic radiation, projected laterally from the semiconductor chip, in a projection direction or deflects electromagnetic radiation, striking outside the component and to be received by the semiconductor chip, toward the semiconductor chip.

4. The component of claim 1, further comprising a shielding layer on a second main face of the chip support, which is opposite to the first main face, for shielding against interfering waves.

5. A module having a plurality of components of claim 2, further comprising a substrate element having a plurality of openings, and wherein the components are each secured to the chip support on one component side of the substrate element in such a way that each housing frame protrudes into or passes through a respective one of the openings.

6. The module of claim 5, wherein the substrate element is a flexible substrate element.

7. The module of claim 5, wherein electrical line structures on the substrate element are embodied for electrically connecting the components.

8. An optical display device having a module of claim 5, wherein a surface of the substrate element on the projection side is radiation-absorbent.

9. The optical display device of claim 8, wherein the surface of the substrate element on the projection side is blackened.

10. An illumination or backlighting device having a module of claim 5, wherein a surface of the substrate element on the projection side is diffusely reflective.

11. The illumination or backlighting device of claim 10, wherein the surface of the substrate element on the projection side is white.

12. The illumination or backlighting device of claim 10, further comprising a scattering plate disposed downstream of the substrate element on the projection side.

13. A liquid crystal display, wherein a device of claim 10 is disposed on a side remote from an observation side.

14. A method for producing and packaging a plurality of components of claim 1, comprising the steps of:
   a) furnishing a chip support film strip;
   b) producing a plurality of pairs of strip conductors, each pair for one semiconductor chip on the chip support film strip;
   c) embodying one housing frame at each place on the chip support film strip where a semiconductor chip or a semiconductor chip array of an individual component is provided;
   d) mounting a plurality of semiconductor chips on the chip support film strip; and
   e) at least partly filling the radiation slots, formed by the housing frames, with a filler compound.

15. The method of claim 14, wherein the chip support film strip, with the mounted and encapsulated semiconductor chips, is rolled up into a packaging unit containing a plurality of surface-mountable components.

16. The method of claim 14, wherein step c) is accomplished by means of injection molding or extrusion.

17. The component of claim 1, wherein the radiation-permeable medium is a filler compound.

18. The component of claim 17, wherein the filler compound contains at least one of a luminescent material and a diffusor material.

* * * * *

UNITED STATES PATENT AND TRADEMARK OFFICE
CERTIFICATE OF CORRECTION

PATENT NO. : 7,446,347 B2  
APPLICATION NO. : 10/362614  
DATED : November 4, 2008  
INVENTOR(S) : Georg Bogner et al.

Page 1 of 1

It is certified that error appears in the above-identified patent and that said Letters Patent is hereby corrected as shown below:

Title Page, Item (73)
(73)   Assignee:    ~~Osram Opto Semiconductors GmbH~~
             ~~Regensburg (De)~~ should read <u>Osram GmbH</u>
             <u>Munich (DE)</u>

Signed and Sealed this  
Twenty-third Day of July, 2013

Teresa Stanek Rea  
*Acting Director of the United States Patent and Trademark Office*